United States Patent
Yen et al.

(10) Patent No.: US 12,420,651 B2
(45) Date of Patent: Sep. 23, 2025

(54) CHARGE PORT COOLING SYSTEM FOR AN ELECTRIC VEHICLE

(71) Applicant: GM Global Technology Operations LLC, Detroit, MI (US)

(72) Inventors: Chih-Hung Yen, Bloomfield Hills, MI (US); Satish P. Ketkar, Troy, MI (US); Peter Paul Andruskiewicz, IV, Ann Arbor, MI (US); Seunghwan Keum, Northville, MI (US); Taeyoung Han, Troy, MI (US); Vicente Domenech-Llopis, Rochester Hills, MI (US); Orlando Saenz Fuentes, St. Clair Shores, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 621 days.

(21) Appl. No.: 17/872,168

(22) Filed: Jul. 25, 2022

(65) Prior Publication Data
US 2024/0025278 A1    Jan. 25, 2024

(51) Int. Cl.
| B60L 53/16 | (2019.01) |
| B60L 53/302 | (2019.01) |
| H05K 7/20 | (2006.01) |

(52) U.S. Cl.
CPC ............ *B60L 53/16* (2019.02); *B60L 53/302* (2019.02); *H05K 7/20936* (2013.01)

(58) Field of Classification Search
CPC .... B60L 53/16; B60L 53/302; H05K 7/20936
USPC ....................................................... 320/119
See application file for complete search history.

(56) References Cited

U.S. PATENT DOCUMENTS

| 10,377,264 B2* | 8/2019 | Lopez .................. B60L 53/16 |
| 11,654,786 B2* | 5/2023 | Han .................. H05K 7/20881 |
| | | 320/109 |
| 2006/0278370 A1* | 12/2006 | Rockenfeller ...... F28D 15/0233 |
| | | 165/104.33 |
| 2012/0301368 A1 | 11/2012 | Dobashi et al. |
| 2014/0338999 A1 | 11/2014 | Fujii et al. |
| 2019/0202302 A1* | 7/2019 | Turik .................. B60L 53/18 |
| 2020/0067237 A1* | 2/2020 | Sarraf .................. G01K 1/18 |
| 2021/0347270 A1* | 11/2021 | Cole .................. B60L 53/16 |
| 2023/0141760 A1* | 5/2023 | Schroth .................. B60L 53/18 |
| | | 361/704 |
| 2023/0299512 A1* | 9/2023 | Bizon .................. H01R 13/512 |
| | | 439/626 |
| 2024/0131940 A1* | 4/2024 | Andruskiewicz, IV ................ |
| | | B60L 53/16 |
| 2024/0131952 A1 | 4/2024 | Wang et al. |
| 2024/0145858 A1 | 5/2024 | Keum et al. |
| 2024/0162559 A1 | 5/2024 | Gao et al. |
| 2024/0195111 A1* | 6/2024 | Heckelsmueller ...... B60L 53/11 |

(Continued)

FOREIGN PATENT DOCUMENTS

CN    113147312 A    7/2021

*Primary Examiner* — Jack Chiang
*Assistant Examiner* — Suchin Parihar
(74) *Attorney, Agent, or Firm* — CANTOR COLBURN LLP

(57) ABSTRACT

A charge port for an electric vehicle includes a first charging terminal, a second charging terminal spaced from the first charging terminal, and a phase change material (PCM) cartridge including a non-porous housing storing an amount of PCM. The non-porous housing is arranged in thermal contact with one of the first charging terminal and the second charging terminal.

20 Claims, 5 Drawing Sheets

(56) References Cited

U.S. PATENT DOCUMENTS

2024/0332841 A1* 10/2024 Winterholler ........ H01R 13/533
2024/0336152 A1* 10/2024 Yen ........................ B60L 53/16

* cited by examiner

CHARGE PORT COOLING SYSTEM FOR AN ELECTRIC VEHICLE

INTRODUCTION

The subject disclosure relates to the art of electric vehicles and, more particularly, to a charge port cooling system for an electric vehicle.

Electric vehicles include a charge port that may serve as an electrical interface with a charging station. The charging station provides electricity to charge an on-board vehicle battery. Often times, the charge port includes a sensor and an onboard control module. The sensor may communicate with the onboard control module, and the onboard control module may communicate with the charging station. For example, the sensor may take the form of a temperature sensor that detects charge port temperatures.

When charge port temperatures exceed a predetermined threshold, the onboard control module or the charging station may derate charging. That is, charging may continue at a reduced rate or may be paused to allow charge port temperatures to drop. The charge rate may be increased and/or charging may be restarted once temperatures fall below the predetermined threshold. Inhibiting a charging rate due to high charging temperatures may be inconvenient to a user. Accordingly, the industry would welcome a charge port cooling system that is not dependent on liquid cooling techniques.

SUMMARY

In a non-limiting example, a charge port for an electric vehicle includes a first charging terminal, a second charging terminal spaced from the first charging terminal, and a phase change material (PCM) cartridge including a non-porous housing storing an amount of PCM. The non-porous housing is arranged in thermal contact with one of the first charging terminal and the second charging terminal.

In addition to one or more of the features described herein the non-porous housing includes a plurality of walls defining a PCM receiving zone, the PCM material being stored in the PCM receiving zone.

In addition to one or more of the features described herein the non-porous housing is formed from a thermally conductive material.

In addition to one or more of the features described herein a heat spreader extending from the one of the plurality of walls into the PCM receiving zone.

In addition to one or more of the features described herein the non-porous housing is in thermally conductive contact with the first charging terminal and the second charging terminal.

In addition to one or more of the features described herein an electrically insulative material provided between the non-porous housing and the first charging terminal and the second charging terminal.

In addition to one or more of the features described herein the electrically insulative material comprises one of a conformal sleeve, a film, a tape, and a coating.

In addition to one or more of the features described herein the non-porous housing includes a first housing portion thermally connected to the first charging terminal and a second housing portion thermally connected to the second charging terminal.

In addition to one or more of the features described herein an electrically insulative layer is disposed between the first housing portion and the second housing portion.

In addition to one or more of the features described herein the PCM material comprises a phase change composite material (PCCM).

In another non-limiting example, an electric vehicle includes a body, a plurality of wheels supporting the body, an electric motor, a battery pack electrically connected to the electric motor, and a charge port supported by the body and electrically connected to the battery pack. The charge port includes a first charging terminal, a second charging terminal spaced from the first charging terminal, and a phase change material (PCM) cartridge including a non-porous housing storing an amount of PCM. The non-porous housing is arranged in thermal contact with one of the first charging terminal and the second charging terminal.

In addition to one or more of the features described herein the non-porous housing includes a plurality of walls defining a PCM receiving zone, the PCM material being stored in the PCM receiving zone.

In addition to one or more of the features described herein the non-porous housing is formed from a thermally conductive material.

In addition to one or more of the features described herein a heat spreader extending from the one of the plurality of walls into the PCM receiving zone.

In addition to one or more of the features described herein the non-porous housing is in thermally conductive contact with the first charging terminal and the second charging terminal.

In addition to one or more of the features described herein an electrically insulative material provided between the non-porous housing and the first charging terminal and the second charging terminal.

In addition to one or more of the features described herein the electrically insulative material comprises one of a conformal sleeve, a film, a tape, and a coating.

In addition to one or more of the features described herein the non-porous housing includes a first housing portion thermally connected to the first charging terminal and a second housing portion thermally connected to the second charging terminal.

In addition to one or more of the features described herein an electrically insulative layer disposed between the first housing portion and the second housing portion.

In addition to one or more of the features described herein the PCM material comprises a phase change composite material (PCCM).

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
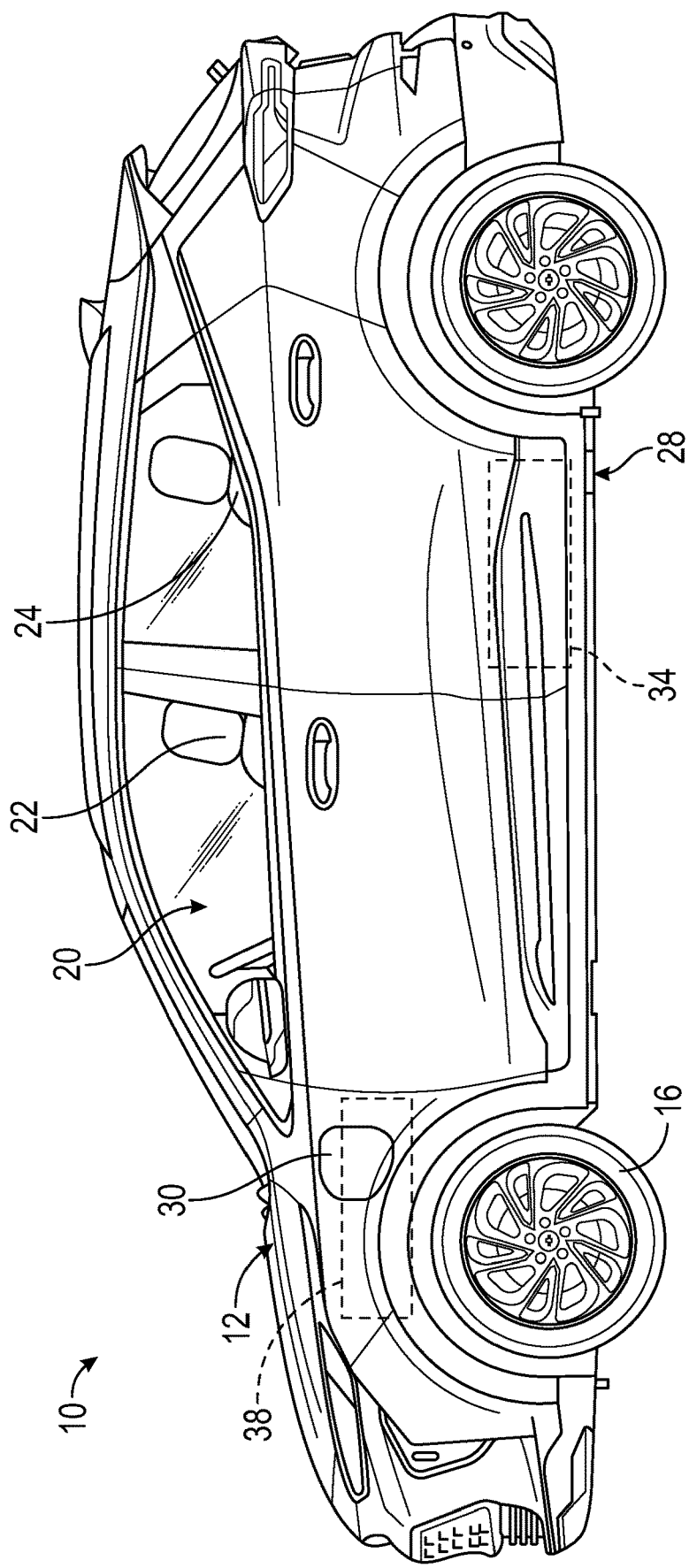
FIG. 1 is a side view of an electric vehicle including a charge port provided with a phase change material (PCM) cooling system, in accordance with a non-limiting example.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

A vehicle, in accordance with a non-limiting example, is indicated generally at 10 in FIG. 1. Vehicle 10 includes a body 12 supported on a frame (not shown) and a plurality of wheels, one of which is indicated at 16. Body 12 includes a passenger compartment 20 that includes at least one driver's seat 22 and at least one rear passenger seat 24. Vehicle 10 takes the form of an electric vehicle (EV) 28 including a charge port 30. Charge port 30 serves as an interface between an external charging device (not shown) and a vehicle battery pack 34. Vehicle battery pack 34 is operatively connected to an electric motor 38 that provides motive power to vehicle 10.

Figure 2:
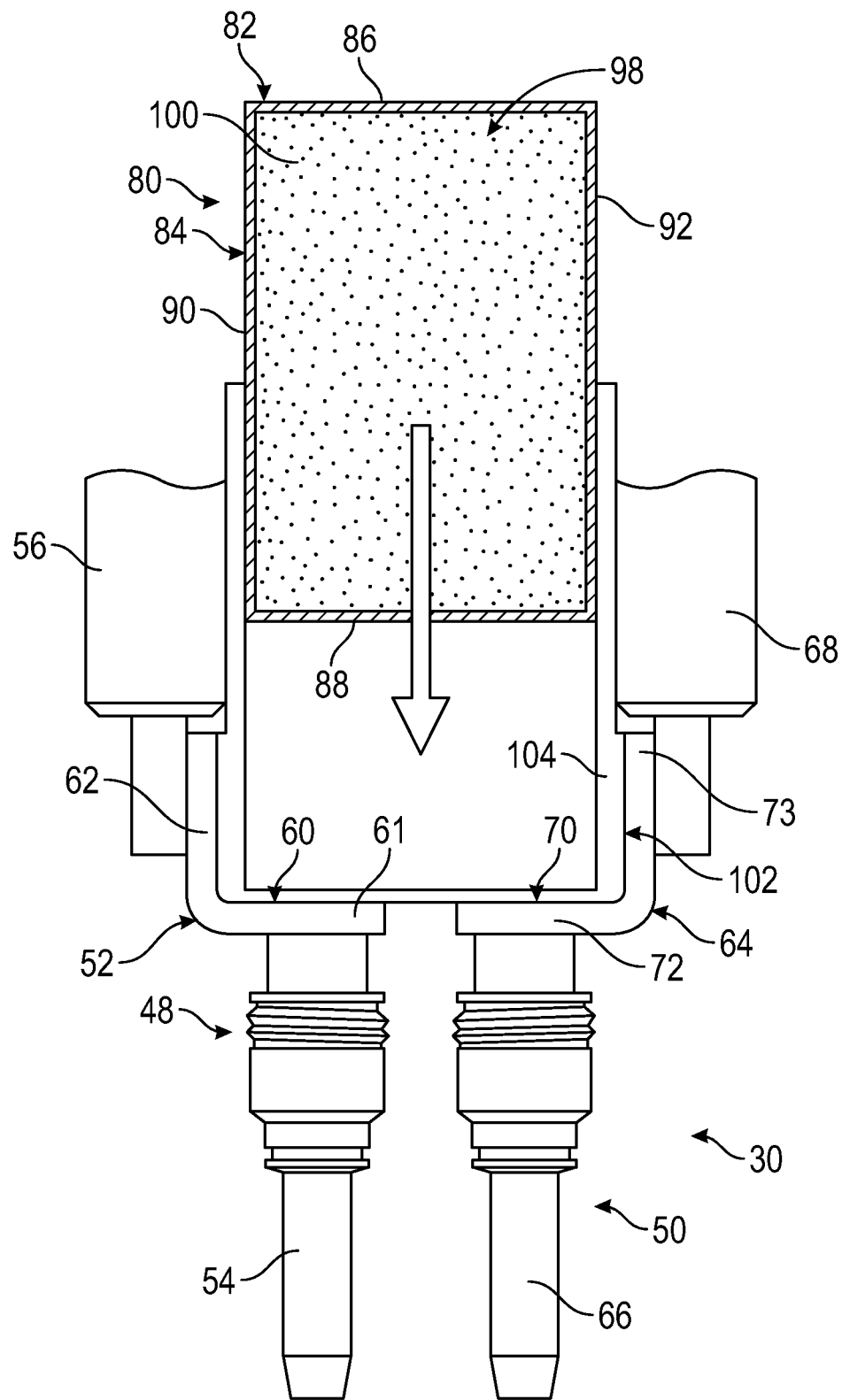
FIG. 2 is a plan view of the charge port including a PCM cartridge disposed in an electrically insulating sleeve, in accordance with a non-limiting example.

Referring to FIG. 2, charge port 30 includes a first charging terminal 48 and a second charging terminal 50. First charging terminal 48 and second charging terminal 50 establish an electrical connection between the external charging device and vehicle battery pack 34. In a non-limiting example, first charging terminal 48 includes a first base 52 that supports a first charging pin 54 and a first electrical conductor 56. First electrical conductor 56 is electrically connected with vehicle battery pack 34. First base 52 includes a first inner surface 60 including a first portion 61 and a second portion 62 that, in a non-limiting example, extends at a right angle relative to first portion 61.

Second charging terminal 50 includes a second base 64 that supports a second charging pin 66 and a second electrical conductor 68. In a manner similar to that discussed herein, second electrical conductor 68 is electrically connected with vehicle battery pack 34. In a non-limiting example, first charging pin 54 may connect with an anode (not shown) of vehicle battery pack 34 through first electrical conductor 56 and second charging pin 66 may connect with a cathode (also not shown) of vehicle battery pack 34 through second electrical conductor 68. Second base 64 includes a second inner surface 70 including a first portion 72 and a second portion 73 that, in a non-limiting example, extends at a right angle relative to first portion 72.

Charge port 30 includes a cooling system in the form of a phase change material (PCM) cartridge 80 that, in accordance with a non-limiting example, is thermally connected with first charging terminal 48 and second charging terminal 50. As will be detailed herein, as PCM cartridge 80 is warmed by ohmic heating induced by electrical flow passing through first charging pin 54 and second charging pin 66, material in PCM cartridge 80 absorbs that heat and, in a non-limiting example, changes phase from a solid state to a liquid state. The change in phase absorbs the heat induced by the electrical flow passing into charging pins 54 and 66 during charging, thereby providing a cooling effect to first charge terminal 48 and second charge terminal 50.

In a non-limiting example, PCM cartridge 80 includes a housing 82 formed from a plurality of walls 84 including a first wall 86, a second wall 88 that is opposite to first wall 86, a third wall 90, a fourth wall 92 as well as fifth and sixth walls (not shown). Housing 82 may be formed from a non-porous, thermally conductive material such as aluminum. Plurality of walls 84 defines a PCM receiving zone 98 that stores an amount of PCM 100. PCM cartridge 80 is in thermally conductive contact with first portion 61 and second portion 62 of first base 52 and first portion 72 and second portion 73 of second base 64. At this point, it should be understood that PCM 100 may take on a variety of forms to include materials that change from solid to gas, materials that change from a solid to liquid, and materials that may change from liquid to gas.

In a non-limiting example, an electrically insulative material 102 which may take the form of a conforming sleeve, a film, a tape, a coating, or a cover 104, is disposed about portions of housing 82. In another non-limiting example, the insulative material 102 may be provided on first base 52 and second base 64. Electrically insulative cover 104 provides a barrier to electrical flow that may pass between first charge terminal 48 and second charge terminal 50 through housing 82. In this manner, PCM cartridge 80 can absorb heat generated by electrical flow passing into first charging pin 54 and second charging pin 66, through corresponding ones of first base 52 and second base 64 and into first electrical conductor 56 and second electrical conductor 68, respectively.

Although not shown, PCM cartridge 80 may be secured to first base 52 and second base 64 through a variety of mechanisms to ensure sufficient thermal transfer. For example, PCM cartridge 80 may be secured to one or more of first and second portions 61 and 62 of first base 52 and first and second portions 72 and 73 of second base 64 by an adhesive, clamps, mechanical fasteners, and the like to ensure a positive thermal transfer from first charging pin 54 and second charging pin 66 into PCM 100.

Figure 3:
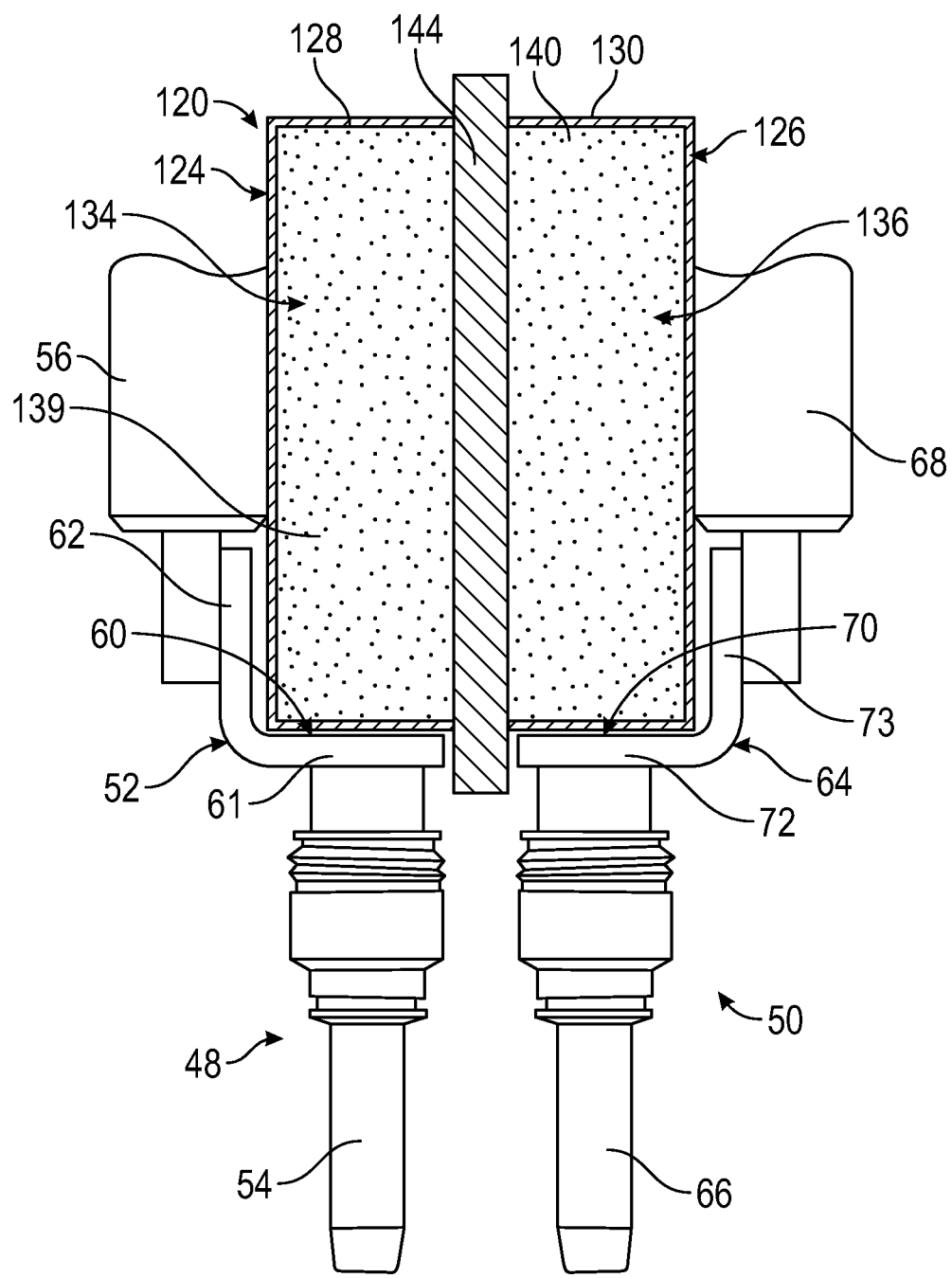
FIG. 3 is a plan view of a charge port including a PCM cartridge including a first housing portion electrically isolated from a second housing portion in accordance with a non-limiting example.

Reference will now follow to FIG. 3 in describing a PCM cartridge 120 in accordance with another non-limiting example. PCM cartridge 120 includes a first housing portion 124 and a second housing portion 126. First housing portion 124 and second housing portion 126 may be formed from a thermally conductive material such as aluminum. First housing portion 124 includes a first plurality of walls 128 and second housing portion 126 includes a second plurality of walls 130. First plurality of walls 128 define a first PCM receiving zone 134 and second plurality of walls 130 define a second PCM receiving zone 136. A first amount of PCM 139 is contained in first PCM receiving zone 134 and a second amount of PCM 140 is contained in second PCM receiving zone 136.

First housing portion 124 is thermally connected with first portion 61 and second portion 62 of first base 52. Second housing portion 126 is thermally connected with first portion 72 and second portion 73 of second base 64. As such, first housing portion 124 absorbs heat produced by electrical energy flowing into first charge terminal 48 and second housing portion 126 absorbs heat produced by electrical energy flow through second charge terminal 50. In a non-limiting example, an electrically insulative layer 144 is arranged between first housing portion 124 and second housing portion 126. Electrically insulative layer 144 prevents unwanted electrical flow between first housing portion 124 and second housing portion 126.

Figure 4:
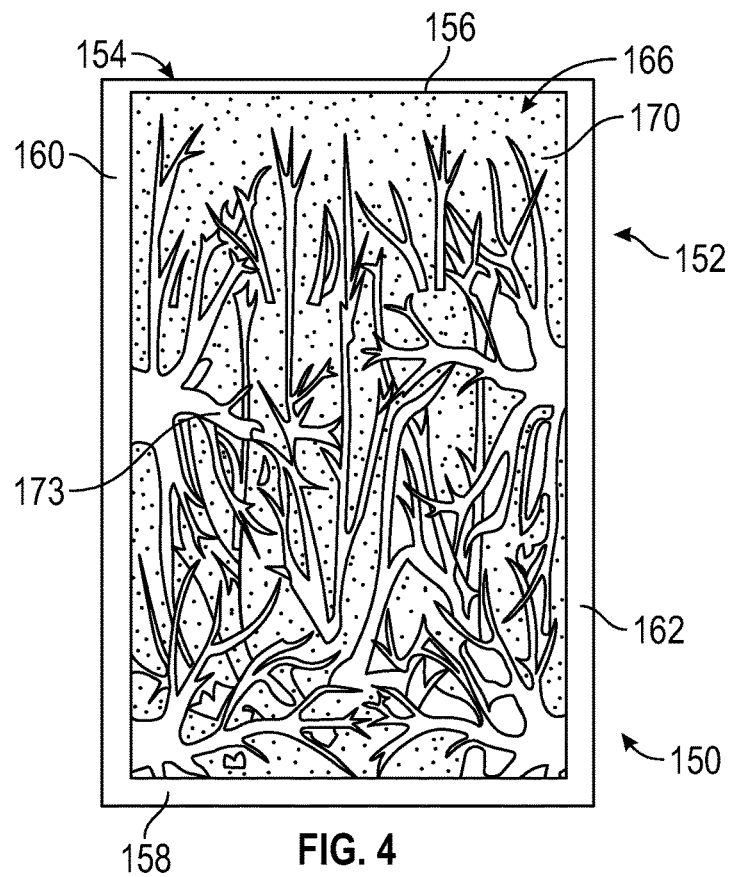
FIG. 4 is a plan view of a PCM cartridge including a heat spreader, in accordance with a non-limiting example.

Reference will now follow to FIG. 4 in describing a PCM cartridge 150 in accordance with another non-limiting example. PCM cartridge 150 includes a housing 152 formed from a plurality of walls 154. Walls 154 include a first wall 156, a second wall 158, a third wall 160, a fourth wall 162 as well as fifth and sixth walls (not shown). Walls 154 define a PCM receiving zone 166 that contains a PCM 170. A heat spreader 173 extends from one or more of walls 154 into PCM receiving zone 166. Heat spreader 173 has a high thermal conductivity, which allows the heat applied at one or more of the walls 154 to quickly spread within the PCM 170 which may have a comparatively low thermal conductivity, thereby enhancing a thermal heat exchange rate between PCM 170 and first and second charge terminals 48 and 50. That is, instead of heat exchange being limited to surfaces of housing 152, heat spreader 173 transfers heat deeper into PCM receiving zone 166 to increase thermal transfer and cooling. Heat spreader 173 may take in a variety of forms and geometries such as a metallic mesh, finned structure, metallic extrusions and the like and may be formed from a variety of thermally conductive materials including metals, thermally conductive foams, and the like.

Figure 5:
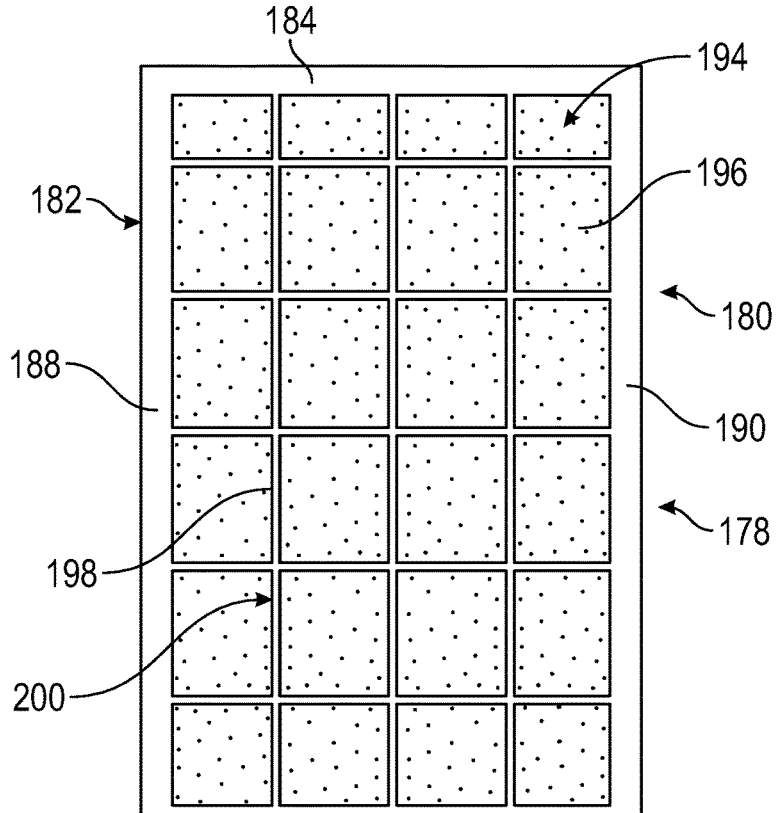
FIG. 5 depicts a PCM cartridge including a heat spreader in accordance with another non-limiting example.

Reference will now follow to FIG. 5 in describing a PCM cartridge 178 in accordance with another non-limiting example. PCM cartridge 178 includes a housing 180 formed from a plurality of walls 182. Walls 182 include a first wall 184, a second wall 186, a third wall 188, a fourth wall 190 as well as fifth and sixth walls (not shown). Walls 182 define a PCM receiving zone 194 that contains a PCM 196. A heat spreader 198 extends from one or more of walls 182 into PCM receiving zone 194. Heat spreader 198 includes a plurality of cells 200 each of which contain a portion of PCM 196. Cells 200 enhance a thermal heat exchange between PCM 196 and first and second charge terminals 48 and 50. That is, instead of heat exchange being limited to surfaces of housing 180, heat spreader 198 transfers heat deeper into PCM receiving zone 194 to increase thermal transfer and cooling.

Figure 6:
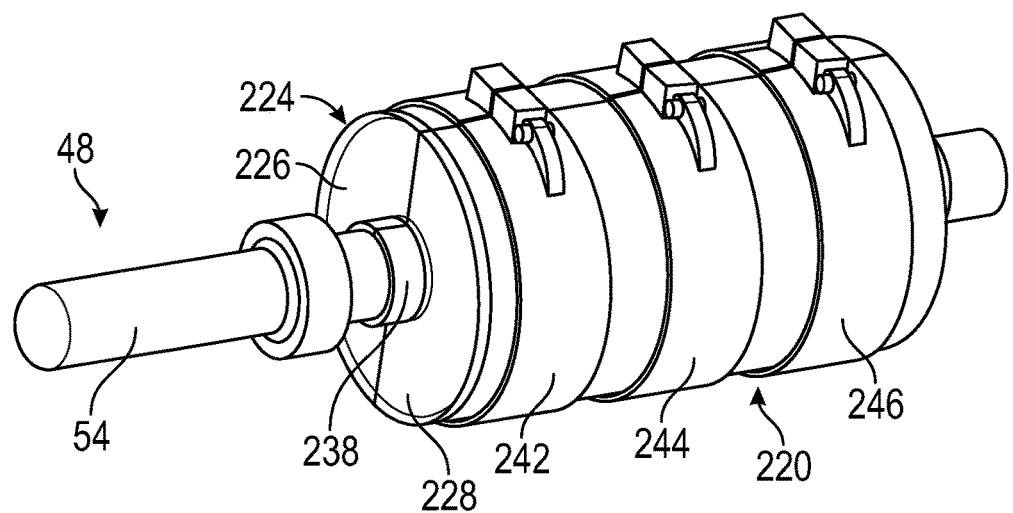
FIG. 6 depicts a PCM cartridge disposed about a charging terminal, in accordance with a non-limiting example.
Figure 7:
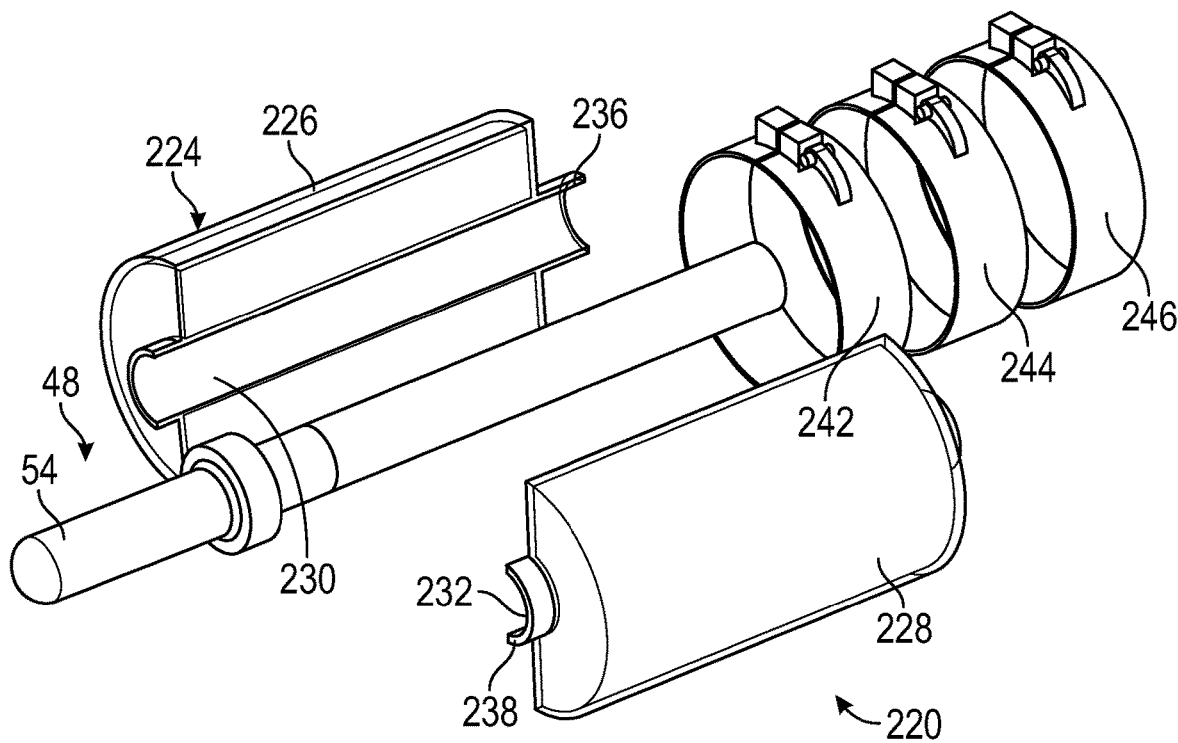
FIG. 7 is a disassembled view of the PCM cartridge of FIG. 6, in accordance with a non-limiting example.

Reference will now follow to FIGS. 6 and 7 in describing a PCM cartridge 220 in accordance with another non-limiting example. PCM cartridge 220 includes a housing 224 having a first housing portion 226 and a second housing portion 228. First and second housing portions 226 and 228 envelop a portion of charging pin 54. First housing portion 226 includes a first semi-circular recess 230 and second housing portion 228 includes a second semi-circular recess 232. First and second semi-circular recesses 230 and 232 extend longitudinally along first and second housing portions 226 and 228, respectively. In a manner similar to that described herein, first housing portion 226 and second housing portion 228 house an amount of PCM (not shown). Each of first housing portion 226 and second housing portion 228 may also include one or more heat spreaders (also not shown) that promote a heat exchange between charging pin 54 and the PCM.

A first insulating film 236 is disposed in first semi-circular recess 230 and a second insulating film 238 is disposed in second semi-circular recess 232. First and second insulating films 236 and 238 electrically isolate first charging pin 54 from first and second housing portions 226 and 228, respectively. In a non-limiting example, first and second housing portions 226 and 228 are placed about first charging pin 54 as shown in FIG. 6. Once in position, a plurality of clamps, three of which are indicated at 242, 244, and 246, are placed about housing 224 and tightened to draw first housing portion 226 and second housing portion 228 towards one another. In this manner, PCM arranged in housing 224 is in thermally conducive contact with first charging pin 54. The PCM material when exposed to heat generated during a charging process may change phase to lower localized temperatures at first charging pin 54. It should be understood that second charging pin 66 may include a similar device.

At this point, it should be understood that the PCM cartridge cooling system in accordance with non-limiting examples is a self-contained cooling system that may reduce temperatures at a charge port for a vehicle. The self-contained system eliminates the need for pumping of fluid and all associated fluid transport maintained. Instead, the PCM cartridge may be easily replaced and/or maintained as needed.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A charge port for an electric vehicle comprising:
   a first charging terminal;
   a second charging terminal spaced from the first charging terminal; and
   a phase change material (PCM) cartridge including a non-porous housing storing an amount of PCM, the non-porous housing being arranged in thermal contact with one of the first charging terminal and the second charging terminal, wherein the non-porous housing includes a plurality of walls defining a PCM receiving zone, the PCM being stored in the PCM receiving zone, and the PCM cartridge includes a heat spreader extending from at least one of the plurality of walls into the PCM receiving zone, the heat spreader configured to transmit heat into an interior of the PCM cartridge.

2. The charge port according to claim 1, wherein the PCM has a first thermal conductivity, and the heat spreader has a second thermal conductivity that is greater than the first thermal conductivity.

3. The charge port according to claim 1, wherein the non-porous housing is formed from a thermally conductive material.

4. The charge port according to claim 1, wherein the heat spreader includes a thermally conductive protrusion that extends from a wall of the plurality of walls and terminates at the interior.

5. The charge port according to claim 1, wherein the non-porous housing is in thermally conductive contact with the first charging terminal and the second charging terminal.

6. The charge port according to claim 5, further comprising an electrically insulative material provided between the non-porous housing and the first charging terminal and the second charging terminal.

7. The charge port according to claim 6, wherein the electrically insulative material comprises one of a conformal sleeve, a film, a tape, and a coating.

8. The charge port according to claim 1, wherein the non-porous housing includes a first housing portion thermally connected to the first charging terminal and a second housing portion thermally connected to the second charging terminal.

9. The charge port according to claim 8, further comprising an electrically insulative layer disposed between the first housing portion and the second housing portion.

10. The charge port according to claim 1, wherein the PCM comprises a phase change composite material (PCCM).

11. An electric vehicle comprising:
a body;
a plurality of wheels supporting the body;
an electric motor;
a battery pack electrically connected to the electric motor; and
a charge port supported by the body and electrically connected to the battery pack, the charge port comprising:
a first charging terminal;
a second charging terminal spaced from the first charging terminal; and
a phase change material (PCM) cartridge including non-porous housing storing an amount of PCM, the non-porous housing being arranged in thermal contact with one of the first charging terminal and the second charging terminal, wherein the non-porous housing includes a plurality of walls defining a PCM receiving zone, the PCM being stored in the PCM receiving zone, and the PCM cartridge includes a heat spreader extending from at least one of the plurality of walls into the PCM receiving zone, the heat spreader configured to transmit heat into an interior of the PCM cartridge.

12. The electric vehicle according to claim 11, wherein the PCM has a first thermal conductivity, and the heat spreader has a second thermal conductivity that is greater than the first thermal conductivity.

13. The electric vehicle according to claim 11, wherein the non-porous housing is formed from a thermally conductive material.

14. The electric vehicle according to claim 11, wherein the heat spreader includes a thermally conductive protrusion that extends from a wall of the plurality of walls and terminates at the interior.

15. The electric vehicle according to claim 11, wherein the non-porous housing is in thermally conductive contact with the first charging terminal and the second charging terminal.

16. The electric vehicle according to claim 15, further comprising an electrically insulative material provided between the non-porous housing and the first charging terminal and the second charging terminal.

17. The electric vehicle according to claim 16, wherein the electrically insulative material comprises one of a conformal sleeve, a film, a tape, and a coating.

18. The electric vehicle according to claim 11, wherein the non-porous housing includes a first housing portion thermally connected to the first charging terminal and a second housing portion thermally connected to the second charging terminal.

19. The electric vehicle according to claim 18, further comprising an electrically insulative layer disposed between the first housing portion and the second housing portion.

20. The electric vehicle according to claim 11, wherein the PCM comprises a phase change composite material (PCCM).

* * * * *